United States Patent [19]

Whittaker et al.

[11] Patent Number: 5,087,953
[45] Date of Patent: Feb. 11, 1992

[54] FLEXIBLE GATE ARRAY SYSTEM FOR COMBINATORIAL LOGIC

[75] Inventors: Bruce E. Whittaker, Mission Viejo; Saul Barajas, Capistrano Beach, both of Calif.

[73] Assignee: Unisys Corporation, Blue Bell, Pa.

[21] Appl. No.: 593,440

[22] Filed: Oct. 5, 1990

[51] Int. Cl.⁵ ............................................. H01L 27/02
[52] U.S. Cl. ..................................... 357/40; 357/45; 357/41; 357/68; 357/74
[58] Field of Search ................. 357/40, 41, 45, 42, 357/68, 74; 437/8; 324/527

[56] References Cited

U.S. PATENT DOCUMENTS

| | | | |
|---|---|---|---|
| 4,688,072 | 8/1987 | Heath et al. | 357/45 |
| 4,819,047 | 4/1989 | Gilfeather et al. | 357/45 X |
| 4,960,724 | 10/1990 | Watanabe et al. | 357/40 X |
| 4,982,114 | 1/1991 | Nakamura et al. | 357/45 X |

*Primary Examiner*—William Mintel
*Attorney, Agent, or Firm*—Alfred W. Kozak; Mark T. Starr

[57] ABSTRACT

A method and technique for inserting additive logic into the architecture of a gate array chip package whereby spare input and output pins can later be used to alter the logic functions by either disabling or enabling certain logic units internal to the chip by external signal injection.

8 Claims, 7 Drawing Sheets

FIG. 8

FLEXIBLE GATE ARRAY SYSTEM FOR COMBINATORIAL LOGIC

FIELD OF THE INVENTION

This disclosure provides a method for architectural enhancement of custom VLSI (Very Large Scale Integration) gate array chips in order to provide reconfiguration flexibility of the internal architecture so as to eliminate the necessity of having to initiate a redesign cycle.

BACKGROUND OF THE INVENTION

Figure 1:
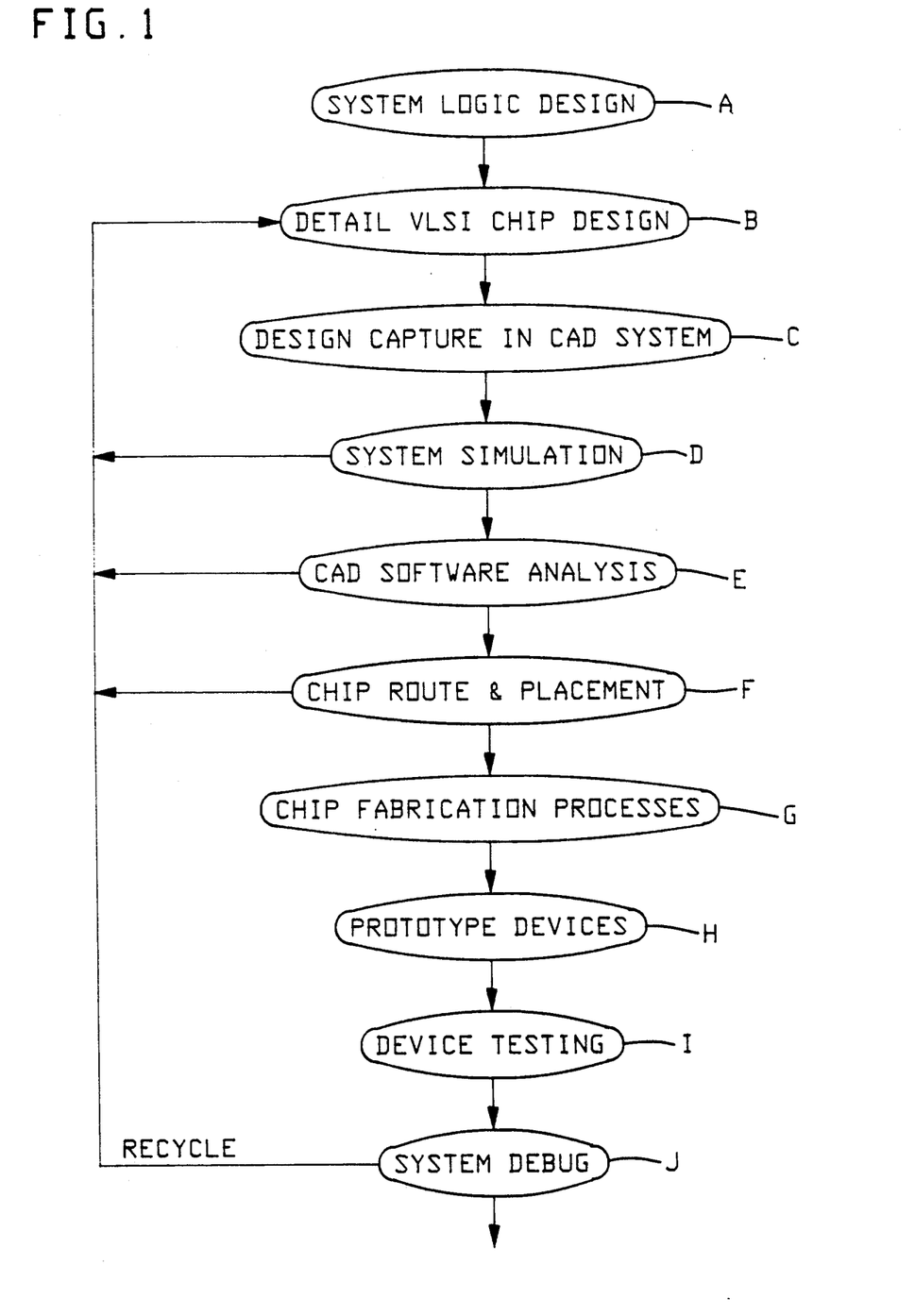
FIG. 1 is a flow chart indicating the various steps in the design cycle of a custom VLSI chip or logic device.

As seen in FIG. 1, the design cycle for a VLSI device involves a series of steps such as that indicated by step A, B, C,. . . J. The time factor in this design cycle may involve periods of 8 to 10 weeks to reach the point of step J which is the system debug operation.

During the "debug" phase of any logic system development, it is always necessary to make hardware changes as various logic "bugs" are found. That is to say, when the originally designed system does not operate as required or desired, it is then necessary to do something to make the system perform as later-realized requirements necessitate.

When the hardware of a system is implemented in standard SSI (Small Scale Integration) and in MSI (Medium Scale Integration) logic chips on logic boards, the necessary hardware changes can often be done quickly by the "cutting" of the board etch and the adding on of patch wires.

As the generation of custom VLSI gate array chips becomes more and more a part of system logic design, then the hardware changes may be difficult or impossible to effectuate. If the changes are "external" to the VLSI chip, then the formerly known techniques of "cutting and adding" can then be used, but, if the problem is found to reside "internally" to the VLSI device, then the physical changes required cannot be done in a short time frame since then, the VLSI design must be "recycled" through the VLSI design cycle shown in FIG. 1 with steps A, B, C,. . . H, I, J having to be reformulated.

This cycle may take as long as another 8 to 10 week period, as previously mentioned, in order to get a new set of prototype chips so that the system debug operation at step J of FIG. 1, can then continue. These types of delays are normally not acceptable in a design schedule for a system.

The simulation phase at step D of FIG. 1 of the design cycle is intended to help eliminate logic errors in the VLSI chip device. A careful, extensive, and intelligent approach to this phase can reduce the possibility of errors. However, experience has shown that rarely is it possible to simulate all the possible and necessary system functions and architecture that will be required for the final operating system.

The present disclosure provides a method of architectural arrangement to overcome the problems encountered in preliminary design when it is not possible for the logic designer to anticipate all the future problem areas or even to anticipate unknown requirements which may show up later. Thus a flexible and alterable design is the lifesaving solution or, that is to say, the design-saving solution during the course of the custom VLSI development cycle.

SUMMARY OF THE INVENTION

The present architectural enhancement and method provides for the use of various, normally un-used spare pins on the gate array package, to be used later, when needed, to disable certain combinatorial logic units in the gate array package, or to enable certain added surplus circuitry placed within the gate array package.

Thus, for example, when several combinatorial logic units feed to an OR gate (which provides an output from the gate array package), the spare input pin, and previously added surplus lines and circuitry, can be used, with an externally derived signal, to disable the common OR gate.

Likewise, combinatorial logic units feeding a common AND gate can be disabled or disconnected by using the normally un-used spare pin to disable the AND gate and its output line, should this later be deemed necessary.

Thus even though the gate array designed package is completed and sealed, it is still possible, using externally generated input signals, via the spare pins, to re-configure the architecture within the package.

DESCRIPTION OF PREFERRED EMBODIMENT

It is a most desirable feature in the designed methodology of VLSI chips, to make the chips "flexible" and to be able to alter their functions thus preventing the necessity of having to "recycle" or redesign a semi-completed gate array chip when system debug operations indicate that changes in function are necessary.

It should be noted that typical custom VLSI gate arrays may contain from 10,000 to 60,000 gate equivalents. These chips are generally packaged in standard chip package sizes where the chip package has various numbers of pin connections, both input pins and output pins. These packages may involve from as few as 40 signal pin connections and total up to as many as 400 signal pin connections into and out of the gate array package.

It is rare that all the possible logic gate units within a custom gate array are used. Similarly it is rare that all the available pin connections (for the package type selected) are used. Thus added chip flexibility can be accomplished by the architectural techniques described herein, and will utilize some of the spare (unused) package pin connections and also use a small amount of the available logic located within the chip device.

The methodology for providing flexibility of the gate array package requires the logic designer, generally, to anticipate possible areas of the gate array logic which may require changing or expanding during the "system debug" operation. It is quite usual that system interfaces are not completely defined or understood at the time of the initial VLSI chip design. It is always hoped that the chip designer may anticipate the need for future functions in certain areas and it is certainly desirable that there be provided flexibility into the designed gate array long in advance of the finally decided functions and operations of the chip.

Figure 2:
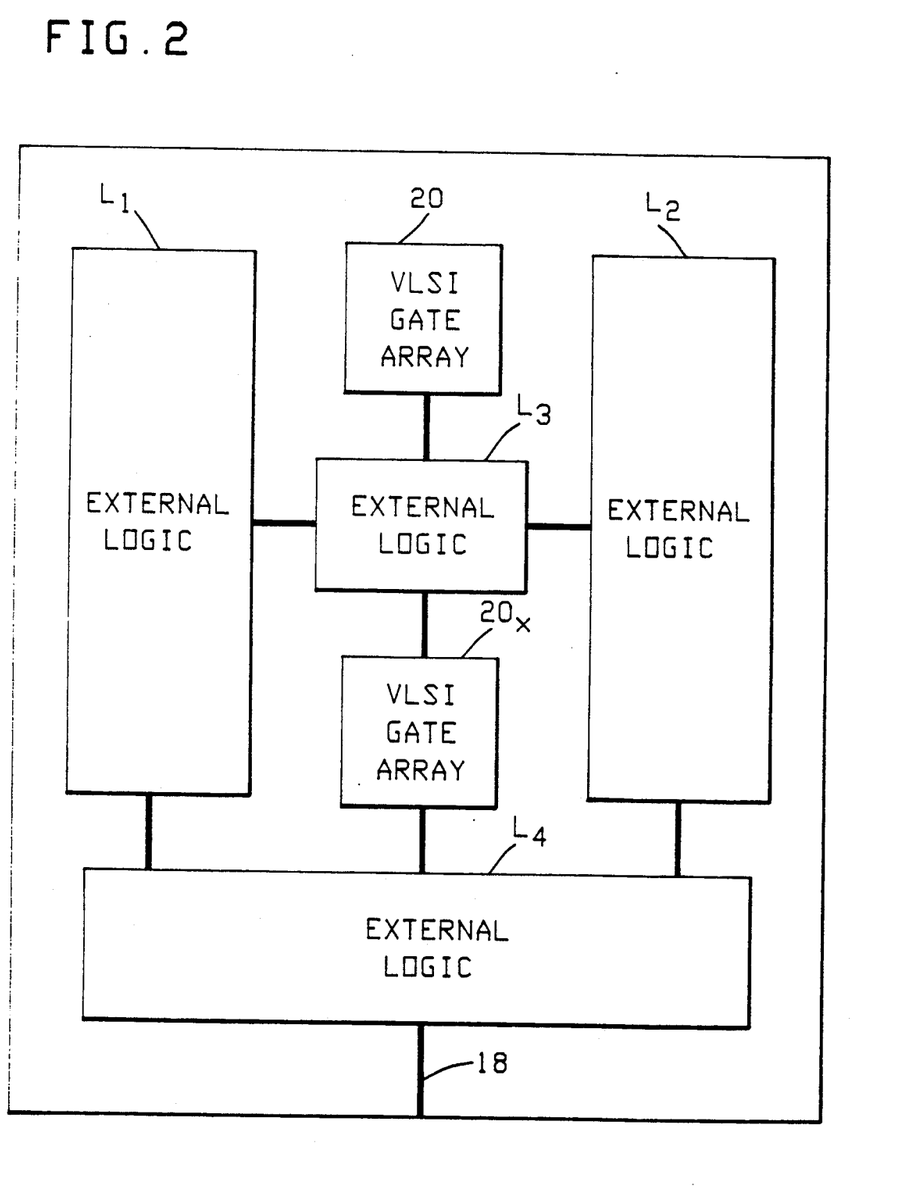
FIG. 2 is a schematic showing how gate array chips may be used and interconnected on a system logic board to cooperate with external logic.

As seen in FIG. 2 there is observed a general block diagram of a system logic board which contains several VLSI gate array chip packages such as 20 and $20_x$. Additionally it is seen that these gate array chip packages are connected to external logic units ($L_1$, $L_2$, $L_3$, $L_4$,) such as SSI Units (small scale integration) and MSI (medium scale integration). When it is known that "debug" changes are possible in the "external logic" but not possible "within" the VLSI gate array chip package devices, the designer should be enabled to use the chip package "spare pins" to permit logic changes within the VLSI chip.

The present architectural additives and methodology presents two general ways of building the required flexible logic for gate array chips. These are:
 (1) flexible (programmable) flip-flops; (spare FF).
 (2) flexible gated logic (using spare pins).

Figure 3:
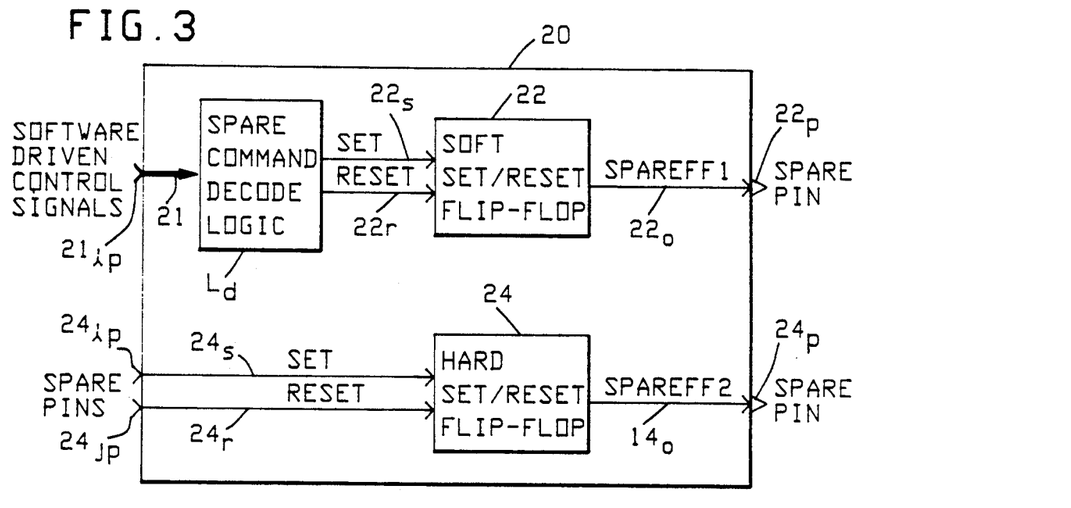
FIG. 3 is a drawing indicating two different types of flip-flops as additives to the normal logic of a gate array chip and which can be used at a later time to make logic changes.

Referring to FIG. 3, there are shown two types of flip-flops that can be added to the VLSI gate array architecture. One type is the "soft" set/reset flip-flop 22 and the second type is the "hard" set/reset flip-flop 24. These types of additive circuitry can be used at a "later time" in order to make desirable logic changes to the existing architecture in the package. The output of each of these flip-flops such as 22 and 24 can be taken to a spare (unused) gate array pin such as $22_p$ and $24_p$ shown in FIG. 3. Additionally the output of each of these flip-flops can be used as part of the internal gate array signal logic of the flip-flop 26 in FIG. 4.

The "soft" set/reset flip-flop 22 shown in FIG. 3 is seen to have an output line $22_O$ which goes to the spare pin $22_p$. The flip-flop 22 has a "set" input $22_2$ and a "reset" input $22_r$, which comes from the spare command decoder logic $L_d$. The control signals coming in on bus 21 into the decoder logic $L_d$ operate via software driven control signals on input pin $21_{ip}$.

The gate array chips in array packages 20 and $20_x$ (FIG. 2) could be involved with any type of package unit such as the dual-in-line package (DIP), the SIP, the PINGRID, or FLATPACK etc. or any type package deemed desirable.

The "soft" flip-flop 22 (FIG. 3) is under control of the software micro-code. To use it, the micro-code will output spare commands which were not used previously. A possible use, is to create a new operation, for example, a new I/O OP which was never used before. The spare command might be set, to state "Burst I/O". The new spare command to the "Burst I/O flip-flop" will be set. This flip-flop can then be used with soft "external" logic. This would require no wiring change from the processor driving the micro-codes to the VLSI gate array package 20.

A flip-flop is "hard" (such as flip-flop 24) because now, it is not controlled by micro-code, but instead physically has a separate line connected to the "set input" and to the "reset input".

In application and use for this flip-flop, flexibility would occur when the printed circuit board is in the debug stage and the design is complete but the board did not have logic in the external logic area; thus, instead of adding another chip, it is possible to use the "spare" flip-flops.

If the gate array chip (as one of its normal functions) provides decoding logic of certain software driven bus signals, and if there are some additional spare decoders available, these can be used to define certain extra "spare" commands in order to set and reset the spare flip-flops. Table I hereinunder gives an example of types of spare decode signals used to set and reset the spare flip-flops. Each spare flip-flop has its output connected to an output spare pin such as $22_p$, $24_p$, etc. of the gate array package 20 of the FIG. 3. Normally, the usage of these flip-flops will be "undefined" at the time of the original gate array design. However, later during system debug these flip-flops will be used via new software driven functions in order to change or alter the operating functions of the chip.

Table I is an example where four new soft set/reset spare flip-flops have been added to the gate array design. These flip-flops may be used at "DEBUG" time for new system needs or requirements. A general principle here involved is that one does not waste any software decode signal values in a gate array design but reserves them for later requirements decided to be useful at debug time.

TABLE I

| | NORMAL CHIP INPUTS | | |
|---|---|---|---|
| COMMAND LINES | SECONDARY COMMAND LINES | | COMMAND DEFINITIONS |
| 0 0 0 0 | x x x x | a | Command #1 |
| 0 0 0 1 | x x x x | a | Command #2 |
| 0 0 1 0 | 0 0 0 0 | a | Sub-Command #0 |
| | 0 0 0 1 | a | Sub-Command #1 |
| | 0 0 1 0 | a | Sub-Command #3 |
| | 0 1 0 0 | a | Sub-Command #4 |
| | 1 0 0 0 | b | Set Spare Flip - Flop 1 |
| | 1 0 0 1 | b | Reset Spare Flip - Flop 1 |
| | 1 0 1 0 | b | Set Spare Flip - Flop 2 |
| | 1 0 1 1 | b | Reset Spare Flip-Flop 2 |
| | 1 1 0 0 | b | Set Spare Flip - Flop 3 |
| | 1 1 0 1 | b | Reset Spare Flip - Flop 3 |
| | 1 1 1 0 | b | Set Spare Flip - Flop 4 |
| | 1 1 1 1 | b | Reset Spare Flip - Flop 4 |
| 0 0 1 1 | x x x x | a | Command #3 |
| . . . . | | | |
| . . . . | | | |
| . . . . | | | |

NOTE:
x x x x = don't care values
a = normal operational commands
b = new commands added (previously undefined)
. . . . = all remaining decodes are defined.

The second type of "hard" flip-flop such as 24 in FIG. 3 uses, for example, spare gate array connection pins such as $24_{ip}$ and $24_{jp}$ (FIGS. 3, 4) in order to set and reset the spare flip-flop 24. This "flexible design additive" provides a flip-flop which allows signals "external" to the gate array package to be connected at a later time in order to set and reset the flip-flop 24 via the set/reset lines $24_s$ and $24_r$. The hard flip-flop 24 has an output line $24_o$ which goes to the spare pin $24_p$.

Figure 4:
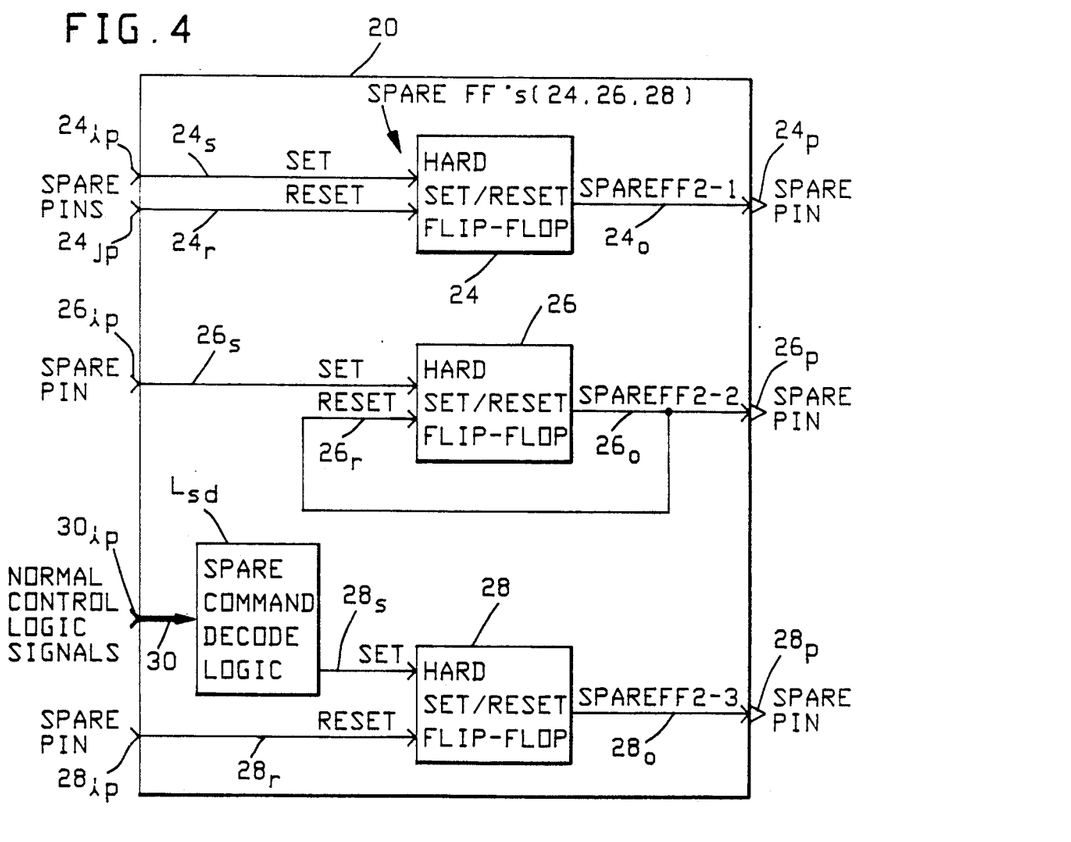
FIG. 4 is a schematic drawing showing three types of hard set/reset flip-flops which can be used as spares in the additive architecture.

FIG. 4 shows 3 varieties of the second type of flip-flops designated as "hard set/reset spare flip-flops". The first flip-flop 24 is identical to that shown in FIG. 3 in that this flip-flop has both the set and reset signals as new spare pin inputs ($24_{ip}$, $24_{jp}$) to the gate array package 20 in FIG. 4.

The second flip-flop 26 shown in FIG. 4 uses its own output signal on line $26_o$ to feed back internal information to the gate array and to act as its reset signal on line $26_r$. This type of flip-flop can be used to produce a one clock time pulse when it is set on line $26_2$ through the spare pin $26_{ip}$.

The third flip-flop 28 of FIG. 4 in a sense combines the "soft" and the "hard" type spare flip-flops. The spare flip-flop 28 is set by a spare command decode logic unit $L_{sd}$ on line $28_s$. The spare command decode logic receives its normal control logic signals through pin $30_{ip}$ and on to bus 30. The reset to flip-flop 28 is done on signal line $28_r$, through the spare input pin $28_{ip}$.

APPLICATION USE FOR SPARE FLIP-FLOP 24 (FIG. 4)

The logic outside the VLSI chip package 20 has been used up, it may be assumed. Thus there is no more room for additional chips. Now instead of delaying use of the printed circuit board by "redesign" in order to add more chips, there can be used a flip-flop which is the hard spare flip-flop 24 of FIG. 4.

This flip-flop will need 3 wires and use 1 wire for each input (two inputs) and 1 wire for the output. This flip-flop 24 is "hard" and is not under micro-code control. This flip-flop can be "on" for as little as one clock period or any desired number of clock periods by controlling the reset input $24_r$. The reset $24_r$ is controlled from the outside, that is (external) to the package 20.

SPARE FLIP-FLOP 26 (FIG. 4)

Again this particular flip-flop is used for debug and correction purposes. Thus when the printed circuit board is almost complete, but needs a flip-flop, as has been later realized, and it is not possible to add more chips, then this flip-flop 26, internal to the chip can be "set" from the outside of the chip but it will reset itself automatically on the next clock via the line $26_r$. This flip-flop 26 generates a pulse which is a one clock wide pulse.

An application of this type additive flip-flop would be to detect a condition such as a "Memory Cycle Complete". The signal from memory may be coming too late to be sent directly to the processing unit. Therefore, it is first sent to the spare flip-flop 26, and then the output of the spare flip-flop 26 has a whole single clock period in order to send the "Memory Cycle Complete" signal to the associated processor. This additive change requires only the 2 additional wires shown in FIG. 4 as $26_s$ and $26_r$, in addition to the output line $26_o$ to the spare output pin $26_p$.

SPARE FLIP-FLOP 28 (FIG. 4)

The setting of this flip-flop 28 is controlled by micro-code. The "resetting" is done by an additional externally connected wire $28_r$. One application use of this flip-flop is to add a new operation to the chip via the spare flip-flop 28. For example, in certain programs it may be desired to add a new operation called "Burst I/O" which is needed to improve performance of the system. Since all the micro-code installed OPS were already connected to the VLSI chip package 20, then in order to provide for this new operation, the micro-code was changed to set this particular spare flip-flop 28 to operate as a "Burst I/O" command. As a result of this "external" control, the logic array would now be in the "Burst Mode". When this I/O was completed, the external logic would reset, via $28_r$, the spare flip-flop 28. This change required only the addition of two extra wire lines.

If this flip-flop 28 had not been used, it might have taken an extra complicated programmable array logic (PAL) chip and possibly 10 connecting wires to do the job. The time to make the physical wiring changes, even provided there was appropriate space on the circuit board, would take approximately 4 hours. On the other hand with the use of the spare flip-flop 28, this alterable change could be done in about a half hour without the addition of any additional chips.

As an example of successful use of the "flexibility technique", the described system was used in the processor of the Unisys A series computer system A6-S. In the initial processor gate array design, seven "spare" flip-flops were added to the architecture. After all of the steps of the design cycle "A" thru "I", the system debug step J occurred and it was possible to define four of the spare flip-flops as an enhancement to the processor logic. Without these added spare flip-flops, it would have been necessary that the gate array architectural design would have required a recycling operation starting back from step "A" back to step "J" all over again.

The following Table II is an example of the use of spare flip-flops which lists the types described in FIGS. 3 and 4 in addition to their eventually defined usages.

In Table II the first column lists the spare flip-flop number while the second column shows the Type 1 as the "soft" flip-flop and the Type 2 as the "hard" flip-flop. The third column shows the usage and function defined for the spare flip-flop involved.

TABLE II

| SPARE FLIP-FLOP | TYPE | DEFINED USAGE |
|---|---|---|
| SPAREFF1 | 1 | Force Memory-Acknowledge condition |
| SPAREFF2 | 1 | Test Status PALs logic |
| SPAREFF3 | 1 | Special I/O Burst Mode |
| SPAREFF4 | 2-2 | Clear PA.L logic |
| SPAREFF5 | 2-3 | (undefined) |
| SPAREFF6 | 2-3 | (undefined) |
| SPAREFF7 | 2-3 | (undefined) |

Previously discussed was the concept of two general methods of building flexible gate array logic which involved (1) flexible (programmable) flip-flops; and (2) flexible gated logic, used in conjunction with combinatorial logic units.

The flexible gated logic of item (2) above is usable with a design technique that works on gated logic VLSI chips. The designer must select critical gate "terms" in the gate array and must add in the spare pin logic as described hereinafter.

Figure 5:
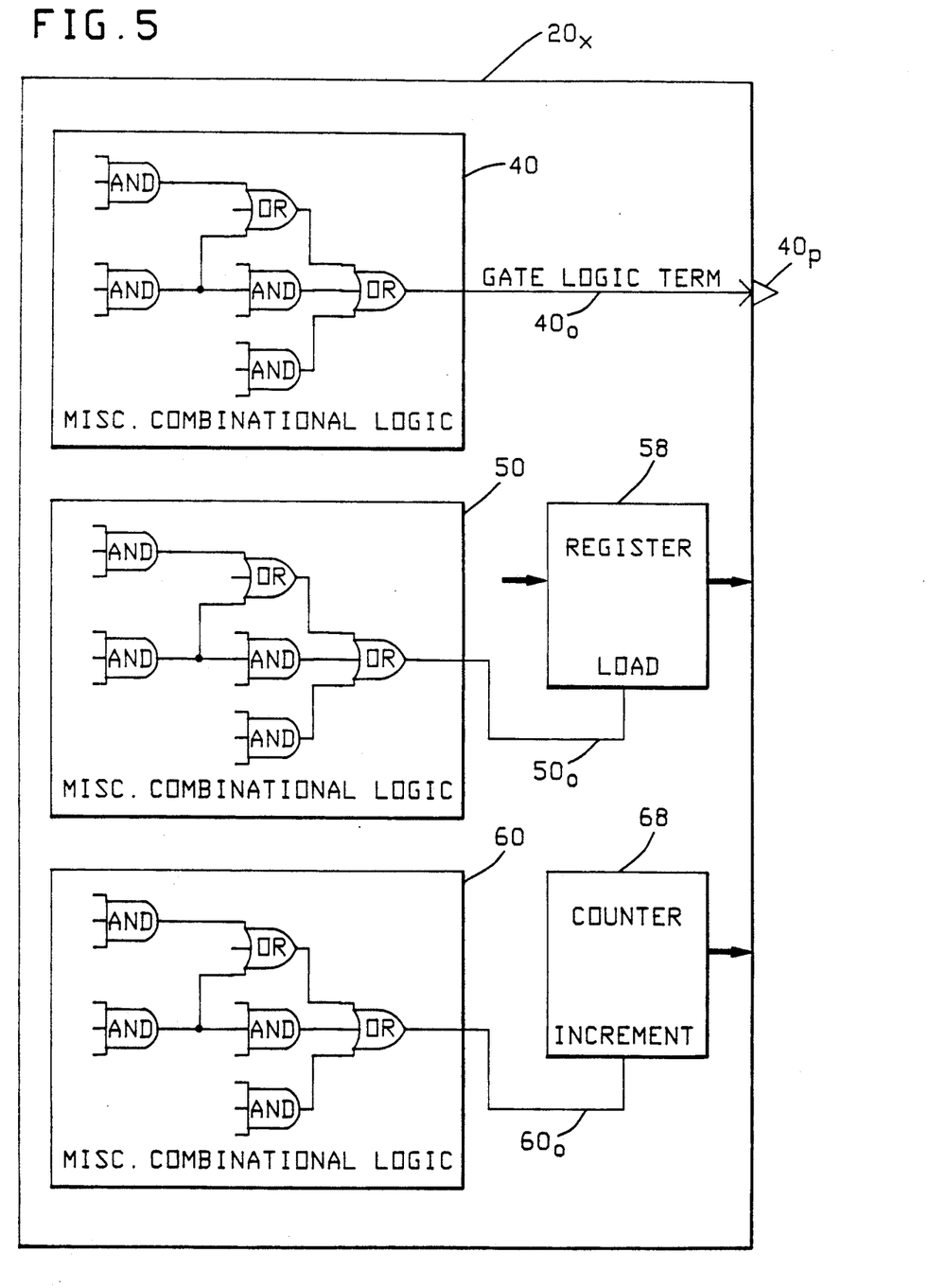
FIG. 5 is a schematic drawing indicating sample types of gate logic used in a gate array chip wherein the architecture is fixed and non-alterable.

FIG. 5 shows several of the "gate logic" types that might be used in order to make the architecture "flexible and alterable". For example, the first type of gate logic 40 shows a large "AND/OR" architectural structure which drives a gate logic term on line $40_o$ on to the output pin $40_p$.

Another type of gate logic 50 in FIG. 5 may provide necessary register load enable control signals. For example, here the register 58 has a input bus and output bus but the register 58 cannot be loaded until the enable signal on line $50_o$ is activated.

Another type of flexible gate logic unit could be that shown at 60 (FIG. 5) which provides the increment and decrement signals on line $60_o$ to the counter 68.

Figure 6:
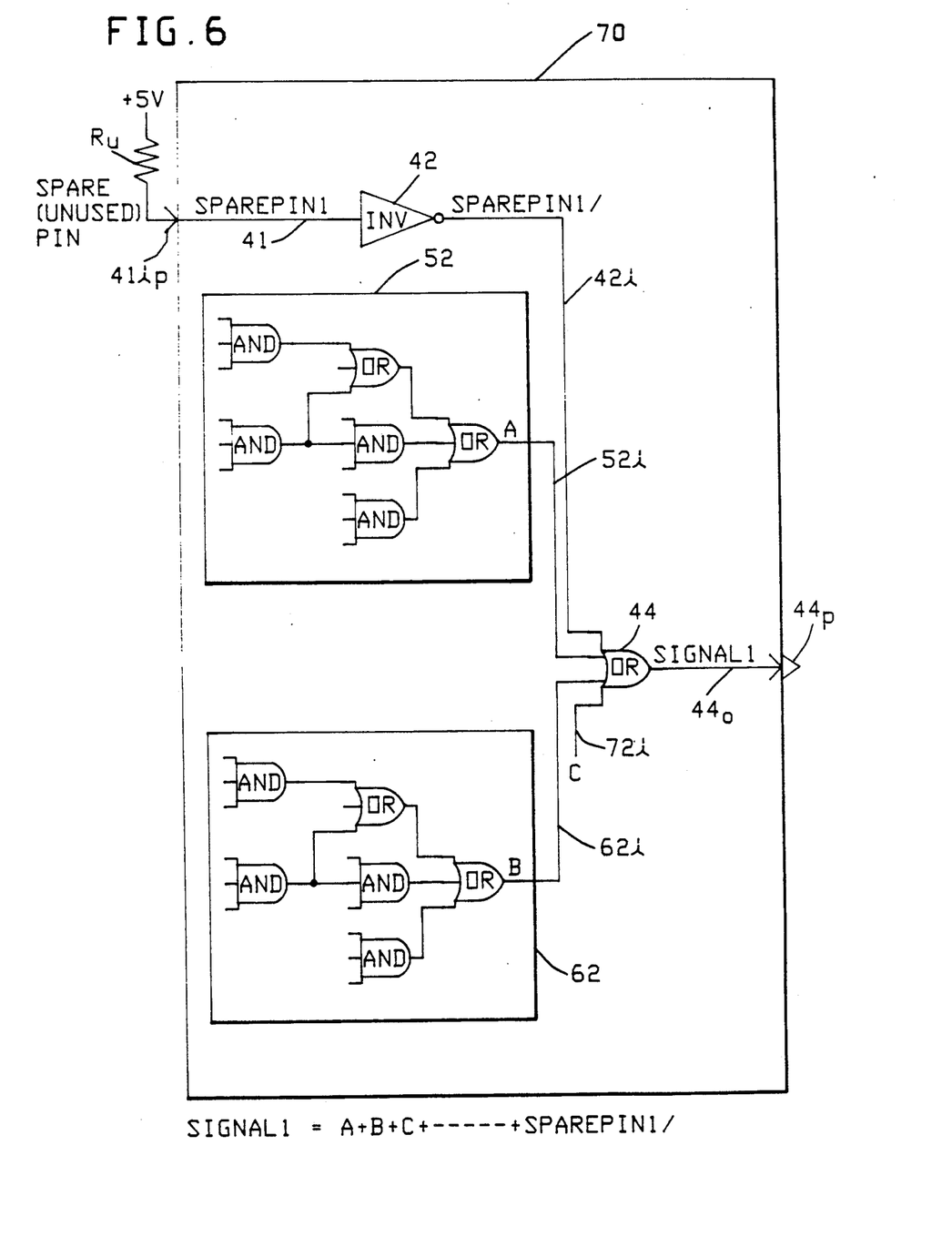
FIG. 6 is a schematic drawing showing how complex combinations of logic units can be "OR'd" and provided with additives using a spare pin to make the chip flexible and alterable.
Figure 7:
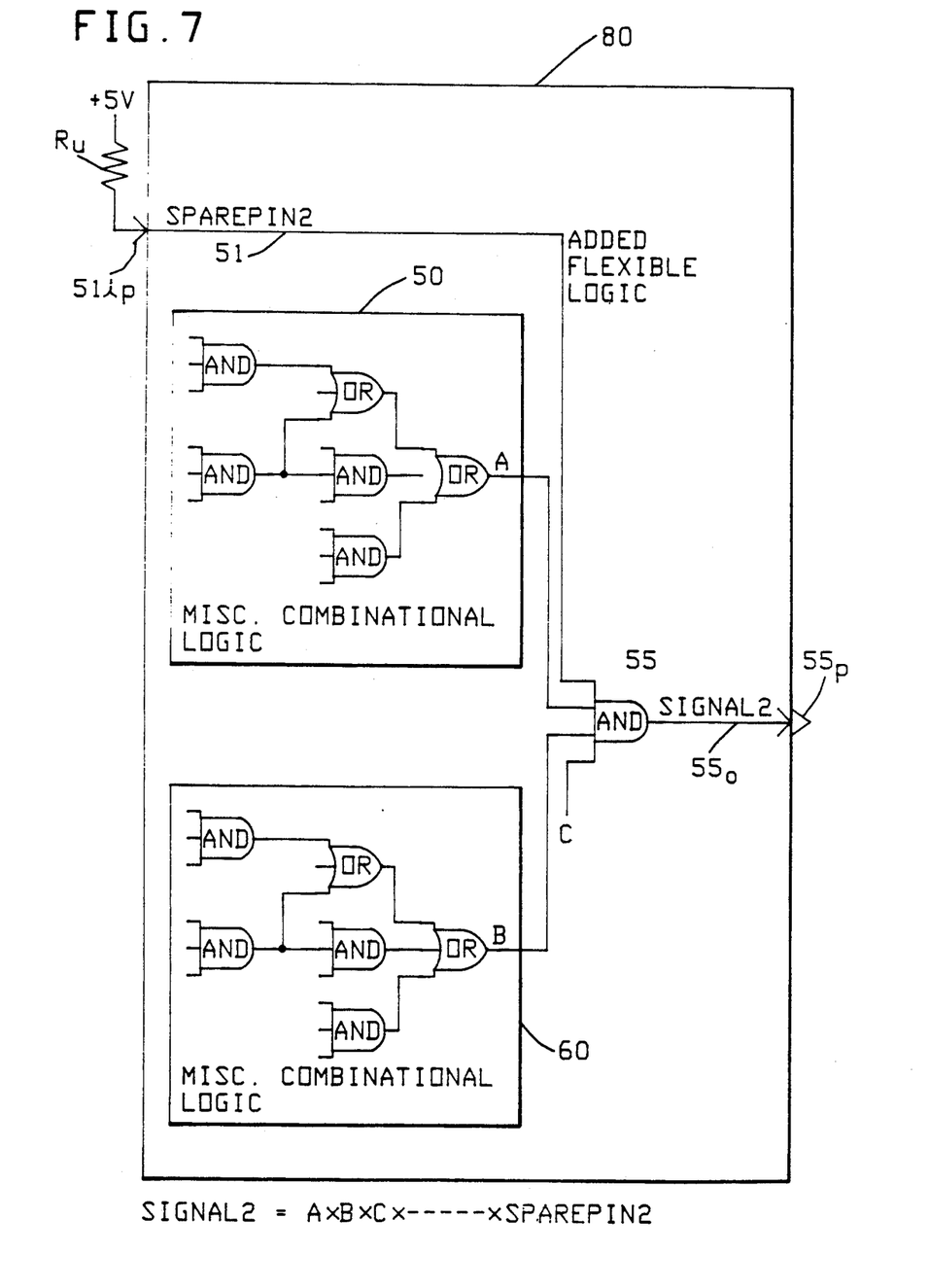
FIG. 7 is a schematic drawing showing how an additive spare pin and logic technique can be used with AND gate structures, to make the chip flexible and alterable.

Thus by adding the flexible spare pin logic units, shown in FIGS. 6 and 7, to these gate structures, the logic can be modified during "debug time" without changing and redesigning the architecture of the gate array.

FIGS. 5, 6, and 7 involve the types of logic called "combinatorial logic". Referring to FIG. 5 and the VLSI gate array package $20_x$, there are seen different types of combinatorial logic units 40, 50, and 60. These units 40, 50, and 60, are "non-flexible" types of logic units such that in case of an unforeseen condition, there would be no way of correcting the operation in these arrays except for going through a complete design recycle period.

In FIG. 5 the register 58 and counter 68 are considered part of the "normal" circuitry inside the array $20_x$.

Thus FIG. 5 shows a "non-flexible" type of design which, in the case of an error in any of the combinatorial logic blocks 40, 50, and or 60, would cause the array to be unworkable and require a design recycling operation which would be very costly and time consuming.

Many control signals are a complex combination of logic equations which are "logically-OR'd" together. FIG. 6 shows such a possible structure. The output of the OR gate 44 provides an output designated Signal 1 on line $44_o$ which exits at the output pin $44_p$. The output Signal 1 is a combination of many other logic signals in the gate array which all pass through the final OR gate 44.

As seen in FIG. 6, there is initially added, to the OR gate 44, one additional OR input condition signal. This is the new "flexible" spare signal on line 41 (Spare Pin 1) which is inserted through the spare (unused) pin $41_{ip}$. The signal line 41 carrying the spare pin 1 signal comes through the inverter circuit 42 into the gate array package 70 of FIG. 6. On the outside of the gate array, this new signal pin, $41_{ip}$, is tied into the "high" condition through a pull-up resistor $R_u$. Under normal conditions, the external signal on spare pin 1 has no effect on the final output Signal 1, $44_o$.

However, in future testing and perhaps during the "debug operations", if external logic is connected to the gate array pin $41_{ip}$ in order to drive the Spare Pin 1 (line 41) to a logical "0", then it becomes a logical "1" at the input to the final OR gate 44 and therefore it activates the output Signal 1 at line $44_o$.

Thus the action of a very complex gated OR term, inside the gate array, can be "altered" by merely modifying the logic "external" to the gate array package 70.

In FIG. 6, the combinatorial logic blocks 52 and 62 which are combined with the OR gate 44 are seen to be the "original" normal logic gates residing inside the VLSI array 70. The inverter 42 provides the means to add logic control to the OR gate 44 from the outside of the chip through the spare pin $41_{ip}$. Therefore, the extraneous additive logic involved herein is the inverter 42 combined with the signal lines 41, $42_i$, and the input pin $41_{ip}$. Pin $41_{ip}$ could also be used to add more logic control conditions from the outside of the array package to the combinatorial logic units via other OR gates within the array package 70.

As seen in FIG. 6, the final OR gate 44 receives inputs on line $42_i$, on line $52_i$, on line $62_i$, and on line $72_i$.

Thus the Signal 1, $44_o$, will be activated if any one of the input lines to the final OR gate 44 has a different signal level from the other input lines.

A methodology of using flexible spare pins and flexible additive logic within the gate array package can also be used on "AND gate" structures. FIG. 7 shows use of a final AND gate structure 55 having an output SIGNAL 2 on line $55_o$ which exits at the output pin $55_p$. In FIG. 7, the output signal, SIGNAL 2, is a complex combination of gated terms being finally logically "ANDED" together. The added flexible spare pin $51_{ip}$ carries a signal term on SPARE input PIN 2 (line 51) which also is connected as input into the final AND gate 55. Thus in addition to the ordinary gate logic such as 50 and 60 of FIG. 7, there has been added the Spare Pin 2 signal which feeds to the AND gate 55 to form SIGNAL 2 on line $55_o$.

Thus the gate array package 80 of FIG. 7 having the combinational logic units 50 and 60 has been "added to" by permitting insertion of a signal on line 51 into the output AND gate 55 to provide the SIGNAL 2 output on line $55_o$.

The added flexible spare input pin $51_{ip}$ is connected to a pull-up resistor $R_u$ in order to apply a voltage such as +5 volts to the Spare Pin 2 input line. Since the signal on line 51 (Spare Pin 2) is "normally" a logical "1", the signal has no effect on the functioning of the SIGNAL 2 output on line $55_o$.

However, at a later time, such as during debug operations, if external logic is added to drive this pin $51_{ip}$ to a logical "0", then the AND gate 55 is disabled.

Thus as will be noted in FIG. 7 the combinatorial logic units 50 and 60 together with the AND gate 55 are the "normal" internal logic in the array 80. The spare pin $51_{ip}$, the signal line 51, are the "extraneous internally added" logic which will then help to provide flexibility to the array.

If, for example, it were found that additional logic was needed in the AND gate 55, then it would be simple to place logic "externally" into the spare pin $51_{ip}$ and thus provide more functionality at the AND gate 55 without the need to recycle the array 80 or to spend extra design time in debugging or recycling the operation.

The OR gate structures of FIG. 6 and the AND gate structures of FIG. 7 can also be combined to provide greater flexibility and alterability in this logic chip array package. This permits the designer, by "external logic" only, to enable or disable the internal AND gates and also to activate or prevent activation of the internal OR gates.

Figure 8:
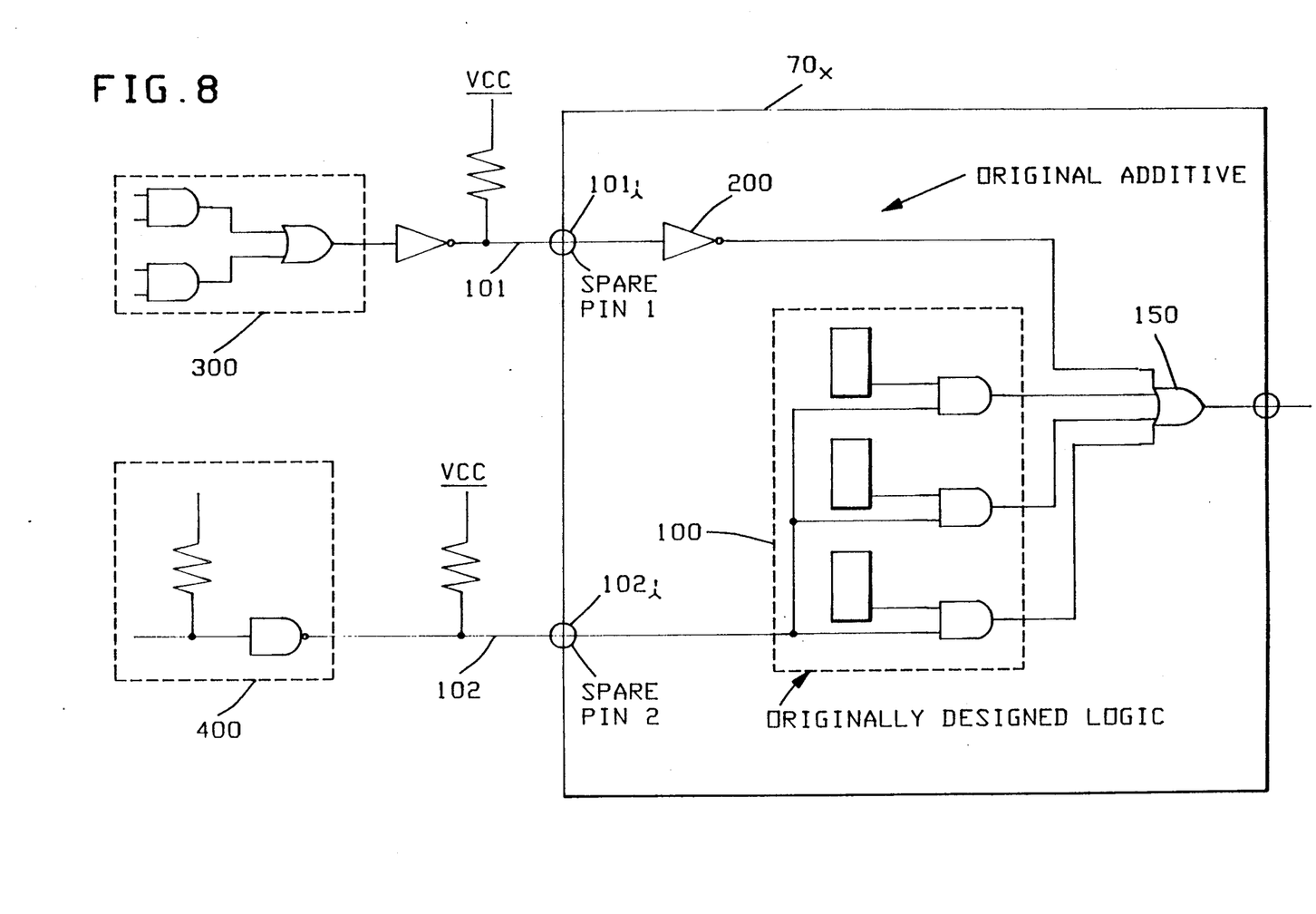
FIG. 8 is a schematic drawing showing the use of both "flexible OR" and "flexible AND" gates for development of a flexible and alterable logic array.

FIG. 8 is a diagram which indicates one way of recovering and implementing all the logic "outside" the gate array package and disabling all the original logic residing "inside" the gate array package $70_x$. As seen in FIG. 8, the block 100 and the OR gate 150 are representative of the "original logic" designed within the array.

The second spare pin 102; and signal 102 provides the means to disable the logic block 100 by means of signals external to the array, that is to say, from the outside. During normal operations, the spare pins $101_i$, and $102_i$, are pulled up to the voltage VCC allowing the internal logic to operate as originally intended. The logic block units 300 and 400 would not normally be present.

However, in order to "disable" the internal logic, the spare input pin 102$_i$ would be connected to a logic "low" from logic block 400. Then the spare pin 101$_i$ would insert the new corrective logic contained in the external logic block 300. Thus the array has the ability to be redesigned and all internal logic can be rearranged from an external source of the gate array package 70$_x$.

These techniques make themselves easy and rapid allowing implementation in the "Debug Step", such as in one day instead of requiring several weeks to redesign and recycle the gate array package.

As an example of how this architectural gate structure methodology could be used successfully, an example may be cited of the Unisys Corporation A6-S processor wherein 7 SPARE PIN signals were added into a critical gate array package and its internal gate signals. Then it was possible to use these additives during debug in order to modify the internal gate array logic by merely changing external hardware. The following Table III herein below gives an example of the SPARE PIN signals that were added into a typical gate array package and shows a brief description of their usefuleness.

TABLE III

| INPUT SPAREPIN SIGNAL | INTERNAL GATE | DESCRIPTION | EXTERNAL SIGNAL |
|---|---|---|---|
| SPAREPIN1 | OSEL (2) | selects data path flow | (unused) |
| SPAREPIN2 | OSEL (1) | selects data path flow | (unused) |
| SPAREPIN3 | OSEL (0) | selects data path flow | (unused) |
| SPAREPIN4 | LDINR | loads data-in register | MDVLDFF_B* |
| SPAREPIN5 | LDINR | loads data-in register | (unused) |
| SPAREPIN6 | OPSEL | selects op-code value | (unused) |
| SPAREPIN7 | BUSCYCLE | OR gate of all cycles | (unused) |

*Signal from Memory Subsystem

Disclosed herein has been a methodology and technique of providing flexibility and alterability in the fabrication of custom VLSI gate array packages so that by careful planning and anticipation of potential future problem areas, it is possible by using a small number of spare pins, and internal logic connections, to avoid the necessity of recycling the gate array design architecture back into a new design cycle, thus avoiding the delays and time scheduling problems, while quickly providing the necessary logic operations for immediate useability.

What is claimed is:

1. A VLSI gate array package carrying more pins than normally required for the internal combinatorial logic and the normal output connections to provide spare normally un-used pins, said package holding a plurality of combinatorial logic units and comprising:

(a) a plurality of combinatorial logic unit means each of which provides an output to a final gate means;
   (b) said final gate means for receiving said outputs of said logic means;
   (c) additive means for receiving signals on said normally un-used gate array package pins, said additive means providing an input to said final gate means.

2. The package of claim 1 wherein each said combinatorial logic unit means includes interconnected combinations of AND gates and OR gates.

3. The package of claim 1 wherein each said combinatorial logic unit means includes interconnected combinations of NAND and NOR gates.

4. The package of claim 1 wherein said final means includes a multiple input OR gate.

5. The package of claim 1 wherein said final gate means includes a multiple input AND gate.

6. The package of claim 1 wherein said additive means includes:

(a) said spare normally un-used pin means for receiving externally generated signals;
   (b) conveyance means to convey said externally generated signals, on the same or reversed polarity, as input to said final gate means.

7. A VLSI gate array package comprising:

(a) a plurality of combinatorial logic units, each said logic units having inputs through normally used package-input pins, and each said logic unit providing an output to a final gate means;
   (b) said final gate means including:
      (b) an OR gate connected to receive the output of each said combinatorial logic unit and having a final signal output connected to a normally-used output pin of said gate array package;
   (c) additive means for providing an extra input to said final gate means, said additive means including:
      (c1) a spare normally unused pin for conveying an external signal to an inverter means;
      (c2) said inverter means for reversing polarity of said external signal and connecting it to said final gate means.

8. A VLSI gate array package having more normally unused pin connections that required for the internal logic and its output signals, said package comprising:

(a) a plurality of combinatorial logic units, each said logic units having inputs through normally used package-input pins, and each said logic unit providing an output to a final gate means;
   (b) said final gate means including:
      (b) an AND gate connected to receive the output of each said combinatorial logic units and having a final signal output connected to a normally used output pin of said gate array package;
   (c) additive means for providing an extra input to said final gate means, said additive means including:
      (c1) a spare normally un-used pin for conveying an external signal to said final gate means.

* * * * *